US010726782B2

United States Patent
Gao et al.

(10) Patent No.: US 10,726,782 B2
(45) Date of Patent: Jul. 28, 2020

(54) PIXEL CIRCUIT, METHOD FOR DRIVING THE SAME, DISPLAY PANEL AND DISPLAY DEVICE

(71) Applicant: BOE Technology Group Co., Ltd., Beijing (CN)

(72) Inventors: Xueling Gao, Beijing (CN); Jikai Yao, Beijing (CN); Kuanjun Peng, Beijing (CN); Chengchung Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/390,204

(22) Filed: Apr. 22, 2019

(65) Prior Publication Data

US 2019/0371238 A1 Dec. 5, 2019

(30) Foreign Application Priority Data

Jun. 1, 2018 (CN) .......................... 2018 1 0558408

(51) Int. Cl.
*G09G 3/3233* (2016.01)
*G09G 3/3266* (2016.01)
*G09G 3/3275* (2016.01)
*H01L 27/32* (2006.01)

(52) U.S. Cl.
CPC ......... *G09G 3/3233* (2013.01); *G09G 3/3266* (2013.01); *G09G 3/3275* (2013.01); *H01L 27/3276* (2013.01); *G09G 2300/043* (2013.01); *G09G 2300/0426* (2013.01); *G09G 2300/0439* (2013.01)

(58) Field of Classification Search
None
See application file for complete search history.

(56) References Cited

U.S. PATENT DOCUMENTS

| 2008/0211397 | A1 | 9/2008 | Choi | |
|---|---|---|---|---|
| 2017/0270860 | A1* | 9/2017 | Wang | ................... G09G 3/3233 |
| 2018/0166025 | A1* | 6/2018 | Zhou | ................... G09G 3/3413 |

FOREIGN PATENT DOCUMENTS

| CN | 102903333 A | 1/2013 |
|---|---|---|
| CN | 106652916 A | 5/2017 |

OTHER PUBLICATIONS

Corresponding Chinese Application 201810558408.9 Office Action dated Aug. 16, 2019.

\* cited by examiner

*Primary Examiner* — Christopher J Kohlman
(74) *Attorney, Agent, or Firm* — Arent Fox LLP; Michael Fainberg

(57) ABSTRACT

A pixel circuit, a method for driving the same, a display panel and a display device are provided. The pixel circuit includes a driver transistor, a data writing sub-circuit, an initializing sub-circuit, a voltage prewriting sub-circuit, a threshold compensating sub-circuit, a first light-emission control sub-circuit, a second light-emission control sub-circuit, a capacitor, and a light-emitting element. The voltage prewriting sub-circuit pre-stores voltage of a light-emission supply voltage terminal into the capacitor before the light-emitting element emits light, the magnitude of light-emission current is dependent upon the voltage of the light-emission supply voltage terminal, and independent of the voltage of the first voltage source.

13 Claims, 9 Drawing Sheets

PIXEL CIRCUIT, METHOD FOR DRIVING THE SAME, DISPLAY PANEL AND DISPLAY DEVICE

CROSS-REFERENCES TO RELATED APPLICATIONS

This application claims priority to Chinese patent application No. 201810558408.9 filed on Jun. 1, 2018, which is incorporated herein by reference in its entirety.

FIELD

The present disclosure relates to the field of display technologies, and particularly to a pixel circuit, a method for driving the same, a display panel and a display device.

BACKGROUND

An Organic Light-Emitting Diode (OLED) display is one of focuses in the research field of flat panel displays, and since the OLED display has low power consumption, a low production cost, self-emission, a wide angle of view, a high response speed, and other advantages over a liquid crystal display, the OLED display has come to take the place of the traditional Liquid Crystal Display (LCD) in the field of mobile phones, Personal Digital Assistants (PDAs), digital cameras, and other flat panel displays. The design of a pixel circuit is a core technology in the OLED display, and a research thereon is of significance.

SUMMARY

In one aspect, an embodiment of the disclosure provides a pixel circuit. The pixel circuit includes: a driver transistor, a data writing sub-circuit, an initializing sub-circuit, a voltage prewriting sub-circuit, a threshold compensating sub-circuit, a first light-emission control sub-circuit, a second light-emission control sub-circuit, a capacitor, and a light-emitting element. The initializing sub-circuit has an output terminal connected with a gate of the driver transistor, and is configured to initialize the gate of the driver transistor under the control of a first scan signal terminal; the data writing sub-circuit has an output terminal connected with a first electrode of the driver transistor, and is configured to provide a signal of a data signal terminal to the first electrode of the driver transistor under the control of a second scan signal terminal; the capacitor is connected between the gate of the driver transistor and a first node, and configured to be charged or discharged according to the potential at the gate of the driver transistor, and the potential at the first node; the voltage prewriting sub-circuit has an output terminal connected with the first node, and is configured to provide a signal of a light-emission supply voltage terminal to the first node under the control of a prewriting control terminal; the threshold compensating sub-circuit is connected between the gate of the driver transistor and a second electrode of the driver transistor, and configured to connect the gate of the driver transistor with the second electrode of the driver transistor under the control of the second scan signal terminal; the first light-emission control sub-circuit is connected between the first node and the first electrode of the driver transistor, and configured to provide voltage of a first voltage source respectively to the first electrode of the driver transistor, and the first node under the control of a first light-emission control terminal; and the second light-emission control sub-circuit is connected between the second electrode of the driver transistor and the light-emitting element, and configured to connect the second electrode of the driver transistor with the light-emitting element under the control of a second light-emission control terminal.

Optionally in the pixel circuit according to the embodiment of the disclosure, the voltage prewriting sub-circuit includes a first transistor. The first transistor has a gate connected with the prewriting control terminal, a first electrode connected with the light-emission supply voltage terminal, and a second electrode connected with the first node.

Optionally in the pixel circuit according to the embodiment of the disclosure, the first light-emission control sub-circuit includes a second transistor and a third transistor. The second transistor has a gate connected with the first light-emission control terminal, a first electrode connected with the first voltage source, and a second electrode connected with the first node; and the third transistor has a gate connected with the first light-emission control terminal, a first electrode connected with the first voltage source, and a second electrode connected with the first electrode of the driver transistor.

Optionally in the pixel circuit according to the embodiment of the disclosure, the prewriting control terminal and the first light-emission control terminal are the same signal terminal; and the first transistor is an N-type transistor, and the second transistor and the third transistor are P-type transistors; or the first transistor is a P-type transistor, and the second transistor and the third transistor are N-type transistors.

Optionally in the pixel circuit according to the embodiment of the disclosure, the data writing sub-circuit includes a fourth transistor. The fourth transistor has a gate connected with the second scan signal terminal, a first electrode connected with the data signal terminal, and a second electrode connected with the first electrode of the driver transistor.

Optionally in the pixel circuit according to the embodiment of the disclosure, the threshold compensating sub-circuit includes a fifth transistor. The fifth transistor has a gate connected with the second scan signal terminal, a first electrode connected with the gate of the driver transistor, and a second electrode connected with the second electrode of the driver transistor.

Optionally in the pixel circuit according to the embodiment of the disclosure, the second light-emission control sub-circuit includes a sixth transistor. The sixth transistor has a gate connected with the second light-emission control terminal, a first electrode connected with the second electrode of the driver transistor, and a second electrode connected with the light-emitting element.

Optionally in the pixel circuit according to the embodiment of the disclosure, the second light-emission control terminal and the first light-emission control terminal are the same signal terminal; and all of the second transistor, the third transistor, and the sixth transistor are N-type transistors; or all of the second transistor, the third transistor, and the sixth transistor are P-type transistors.

Optionally in the pixel circuit according to the embodiment of the disclosure, the initializing sub-circuit includes a seventh transistor. The seventh transistor has a gate connected with the first scan signal terminal, a first electrode connected with an initial signal terminal, and a second electrode connected with the gate of the driver transistor.

Optionally in the pixel circuit according to the embodiment of the disclosure, the voltage prewriting sub-circuit includes a first transistor, the first transistor has a gate connected with the prewriting control terminal, a first electrode connected with the light-emission supply voltage terminal, and a second electrode connected with the first node; the first light-emission control sub-circuit includes a second transistor and a third transistor, the second transistor has a gate connected with the first light-emission control terminal, a first electrode connected with the first voltage source, and a second electrode connected with the first node; and the third transistor has a gate connected with the first light-emission control terminal, a first electrode connected with the first voltage source, and a second electrode connected with the first electrode of the driver transistor; the data writing sub-circuit includes a fourth transistor, the fourth transistor has a gate connected with the second scan signal terminal, a first electrode connected with the data signal terminal, and a second electrode connected with the first electrode of the driver transistor; the threshold compensating sub-circuit includes a fifth transistor, the fifth transistor has a gate connected with the second scan signal terminal, a first electrode connected with the gate of the driver transistor, and a second electrode connected with the second electrode of the driver transistor; the second light-emission control sub-circuit includes a sixth transistor, the sixth transistor has a gate connected with the second light-emission control terminal, a first electrode connected with the second electrode of the driver transistor, and a second electrode connected with the light-emitting element; the initializing sub-circuit includes a seventh transistor, the seventh transistor has a gate connected with the first scan signal terminal, a first electrode connected with an initial signal terminal, and a second electrode connected with the gate of the driver transistor.

In another aspect, an embodiment of the disclosure further provides a method for driving the pixel circuit above. The method includes: in an initialization period, initializing, by the initializing sub-circuit, the gate of the driver transistor under the control of the first scan signal terminal, providing, by the voltage prewriting sub-circuit, the signal of the light-emission supply voltage terminal to the first node under the control of the prewriting control terminal, and the capacitor being charged; in a data writing period, providing, by the data writing sub-circuit, the signal of the data signal terminal to the first electrode of the driver transistor under the control of the second scan signal terminal, connecting, by the threshold compensating sub-circuit, the gate of the driver transistor with the second electrode of the driver transistor under the control of the second scan signal terminal, providing, by the voltage prewriting sub-circuit, the signal of the light-emission supply voltage terminal to the first node under the control of the prewriting control terminal, and the capacitor being charged until the voltage at the gate of the driver transistor is the threshold voltage of the driver transistor plus the voltage of the data signal terminal; in a light-emission period, providing, by the first light-emission control sub-circuit, the voltage of the first voltage source respectively to the first electrode of the driver transistor and the first node under the control of the first light-emission control terminal, connecting, by the second light-emission control sub-circuit, the second electrode of the driver transistor with the light-emitting element under the control of the second light-emission control terminal, keeping, by the capacitor, the voltage at the gate of the driver transistor to be stable, and driving, by the driver transistor, the light-emitting element to emit light.

In another aspect, an embodiment of the disclosure further provides an organic light-emitting diode display panel including the pixel circuit according to any one of the embodiments above of the disclosure.

In another aspect, an embodiment of the disclosure further provides a display device including the organic light-emitting diode display panel above.

DETAILED DESCRIPTION

Figure 1:
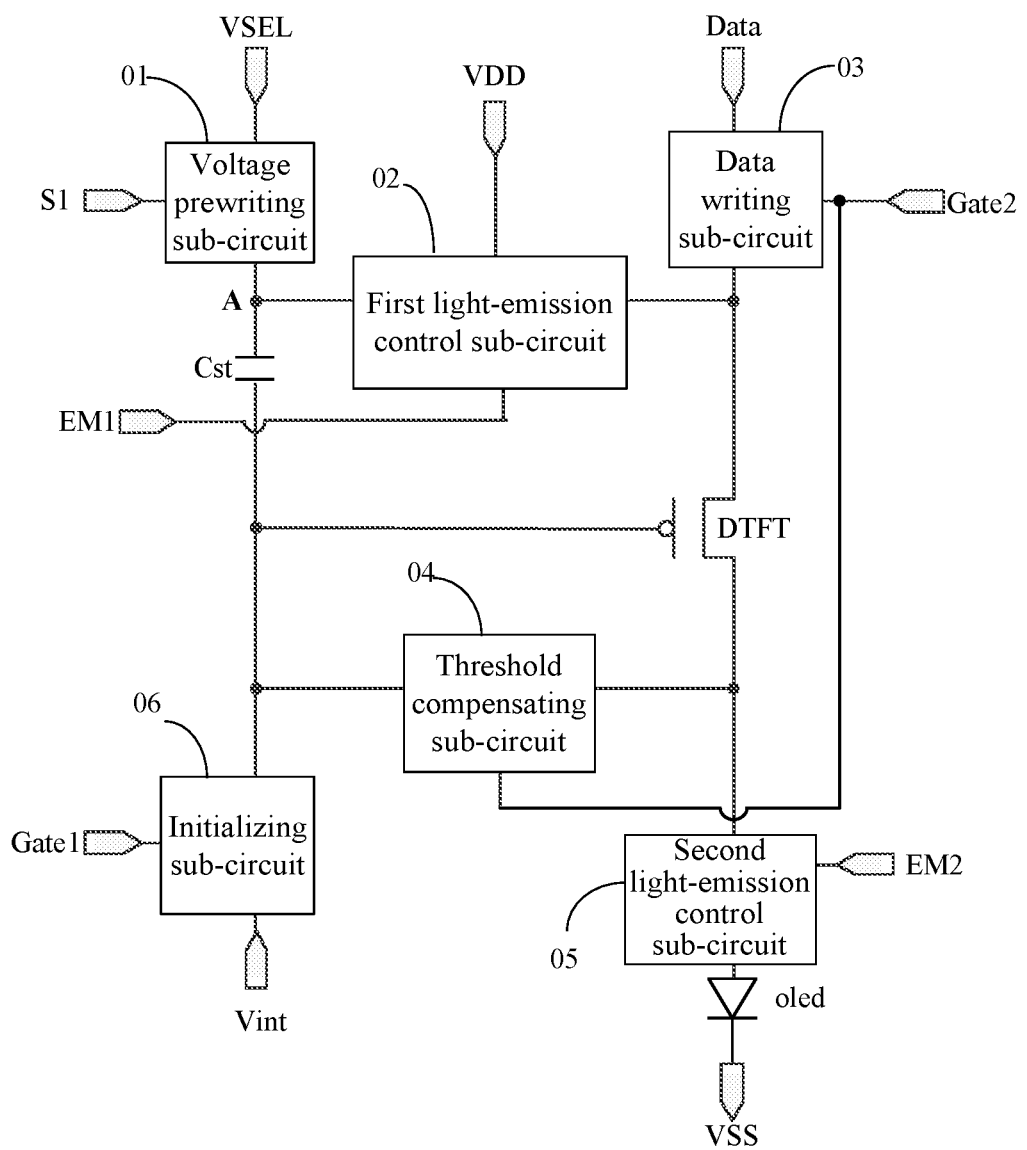
FIG. 1 is a first schematic structural diagram of a pixel circuit according to an embodiment of the disclosure.

In the pixel circuit, a voltage source VDD signal is input to the conventional circuit after an OLED light-emission control signal is enabled, and since a metal VDD wire is arranged in a column, light-emission current I (oled) is flowing constantly through the VDD wire during light emission of one frame, and there is a voltage drop over a transmission distance, thus resulting in non-uniform gray-scales at proximate and distal ends of the display screen.

In view of this, embodiments of the disclosure provide a pixel circuit, a method for driving the same, an organic light-emitting diode display panel, and a display device so as to address the problem of the non-uniformity of a displayed image.

The embodiments of the disclosure provide a pixel circuit, a method for driving the same, an organic light-emitting diode display panel, and a display device so as to address the problem in the prior art of the non-uniformity of a displayed image. In order to make the objects, technical solutions, and advantages of the disclosure more apparent, the disclosure will be described below in further details with reference to the drawings. Apparently the embodiments to be described are only a part but all of the embodiments of the disclosure. Based upon the embodiments here of the disclosure, all of other embodiments which can occur to those ordinarily skilled in the art without any inventive effort shall come into the scope of the disclosure as claimed.

The shapes and sizes of respective components in the drawings are not intended to reflect any real proportion, but only intended to illustrate the disclosure of the disclosure.

As illustrated in FIG. 1, a pixel circuit according to an embodiment of the disclosure includes: a driver transistor DTFT, a data writing sub-circuit 03, an initializing sub-circuit 06, a voltage prewriting sub-circuit 01, a threshold compensating sub-circuit 04, a first light-emission control sub-circuit 02, a second light-emission control sub-circuit 05, a capacitor Cst, and a light-emitting element oled.

The initializing sub-circuit 06 has an output terminal connected with a gate of the driver transistor DTFT, and is configured to initialize the gate of the driver transistor DTFT under the control of a first scan signal terminal Gate1.

The data writing sub-circuit 03 has an output terminal connected with a first electrode of the driver transistor DTFT, and is configured to provide a signal of a data signal terminal Data to a first electrode of the driver transistor DTFT under the control of a second scan signal terminal Gate2.

The capacitor Cst is connected between the gate of the driver transistor DTFT and a first node A, and configured to be charged or discharged according to the potential at the gate of the driver transistor DTFT, and the potential at the first node A.

The voltage prewriting sub-circuit 01 has an output terminal connected with the first node A, and is configured to provide a signal of a light-emission supply voltage terminal VSEL to the first node A under the control of a prewriting control terminal S1.

The threshold compensating sub-circuit 04 is connected between the gate of the driver transistor DTFT and the second electrode of the driver transistor DTFT, and configured to connect the gate of the driver transistor DTFT with the second electrode of the driver transistor DTFT under the control of the second scan signal terminal Gate2.

The first light-emission control sub-circuit 02 is connected between the first node A and the first electrode of the driver transistor DTFT, and is configured to provide voltage of a first voltage source VDD respectively to the first electrode of the driver transistor DTFT, and the first node A under the control of a first light-emission control terminal EM1.

The second light-emission control sub-circuit 05 is connected between the second electrode of the driver transistor DTFT and the light-emitting element oled, and is configured to connect the second electrode of the driver transistor DTFT with the light-emitting element oled under the control of a second light-emission control terminal EM2.

The pixel circuit above according to the embodiment of the disclosure includes a driver transistor, a data writing sub-circuit, an initializing sub-circuit, a voltage prewriting sub-circuit, a threshold compensating sub-circuit, a first light-emission control sub-circuit, a second light-emission control sub-circuit, a capacitor, and a light-emitting element, where the initializing sub-circuit is configured to initialize a gate of the driver transistor to thereby reset the gate of the driver transistor; the data writing sub-circuit is configured to provide a signal of a data signal terminal to a first electrode of the driver transistor to thereby write the data; the capacitor is configured to be charged or discharged; the voltage prewriting sub-circuit is configured to provide a signal of a light-emission supply voltage terminal to a first node to thereby store in advance the voltage of the light-emission supply voltage terminal in the capacitor; the threshold compensating sub-circuit is configured to connect the gate of the driver transistor with a second electrode of the driver transistor to thereby compensate for threshold voltage; the first light-emission control sub-circuit is configured to provide voltage of a first voltage source respectively to the first node of the driver transistor, and the first node; and the second light-emission control sub-circuit is configured to connect the second electrode of the driver transistor with the light-emitting element, so that the light-emitting element emits light. However since the voltage prewriting sub-circuit stores in advance the voltage of the light-emission supply voltage terminal into the capacitor before light emission, although light emission is driven by the first voltage source, the magnitude of light-emission current is dependent upon the voltage of the light-emission supply voltage terminal, and independent of the voltage of the first voltage source, thus avoiding a voltage drop of the first voltage source in a light-emission period from affecting the light-emitting element, and improving the non-uniformity of a displayed image on an OLED display screen.

The disclosure will be described below in details in connection with a particular embodiment. It shall be noted that this embodiment is intended to better explain the disclosure, but not to limit the disclosure thereto.

Figure 2:
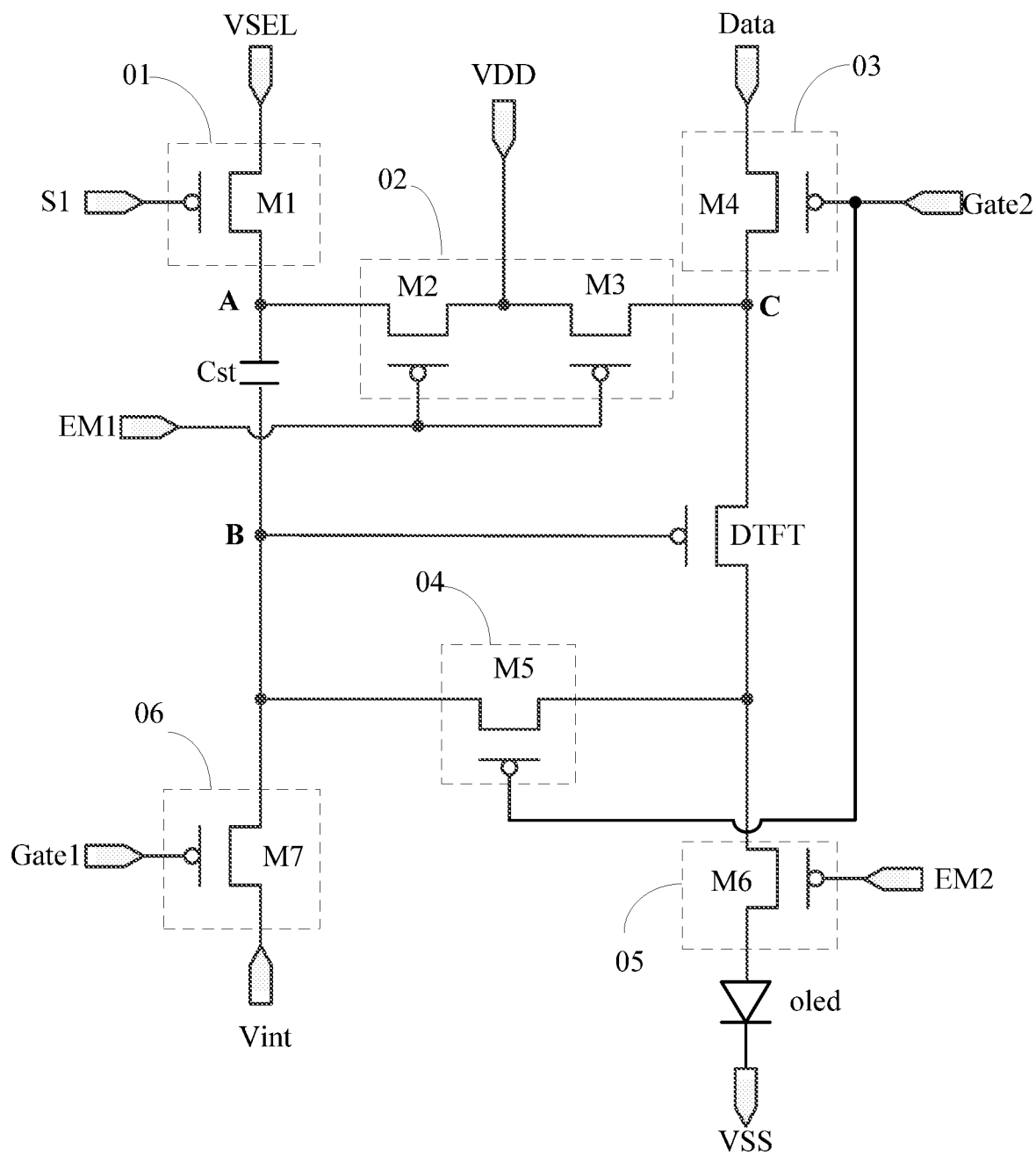
FIG. 2 is a second schematic structural diagram of the pixel circuit according to the embodiment of the disclosure.

In some embodiments of the disclosure, in the pixel circuit, as illustrated in FIG. 2, the voltage prewriting sub-circuit 01 includes a first transistor M1.

The first transistor M1 has a gate connected with the prewriting control terminal S1, a first electrode connected with the light-emission supply voltage terminal VSEL, and a second electrode connected with the first node A.

Specifically when the first transistor M1 is turned on under the control of the prewriting control terminal S1, the voltage of the light-emission supply voltage terminal VSEL is transmitted to the first node A, i.e., one end of the capacitor Cst, through the first transistor M1 which is turned on, and the capacitor Cst stores the voltage to drive the light-emitting element to emit light.

In a specific implementation, the first transistor M1 can be an N-type transistor, or can be a P-type transistor, although the embodiment of the disclosure will not be limited thereto.

A specific structure of the voltage prewriting sub-circuit 01 in the pixel circuit has been described above only by way of an example, and in a specific implementation, the specific structure of the voltage prewriting sub-circuit 01 will not be limited to the structure above according to the embodiment of the disclosure, but can alternatively be another structure which can occur to those skilled in the art, and the embodiment of the disclosure will not be limited thereto.

In some embodiments of the disclosure, in the pixel circuit, as illustrated in FIG. 2, the first light-emission control sub-circuit 02 includes a second transistor M2 and a third transistor M3.

The second transistor M2 has a gate connected with the first light-emission control terminal EM1, a first electrode connected with the first voltage source VDD, and a second electrode connected with the first node A.

The third transistor M3 has a gate connected with the first light-emission control terminal EM1, a first electrode connected with the first voltage source VDD, and a second electrode connected with the first electrode of the driver transistor DTFT.

Specifically when the second transistor M2 is turned on under the control of the first light-emission control terminal EM1, the voltage of the first voltage source VDD is transmitted to the first node A through the second transistor M2 which is turned on; and when the third transistor M3 is turned on under the control of the first light-emission control terminal EM1, the voltage of the first voltage source VDD is transmitted to the first electrode of the driver transistor DTFT through the third transistor M3 which is turned on.

In a specific implementation, the second transistor M2 and the third transistor M3 can be N-type transistors, or can be P-type transistors, although the embodiment of the disclosure will not be limited thereto.

A specific structure of the first light-emission control sub-circuit 02 in the pixel circuit has been described above only by way of an example, and in a specific implementation, the specific structure of the first light-emission control sub-circuit 02 will not be limited to the structure above according to the embodiment of the disclosure, but can alternatively be another structure which can occur to those skilled in the art, and the embodiment of the disclosure will not be limited thereto.

Figure 3:
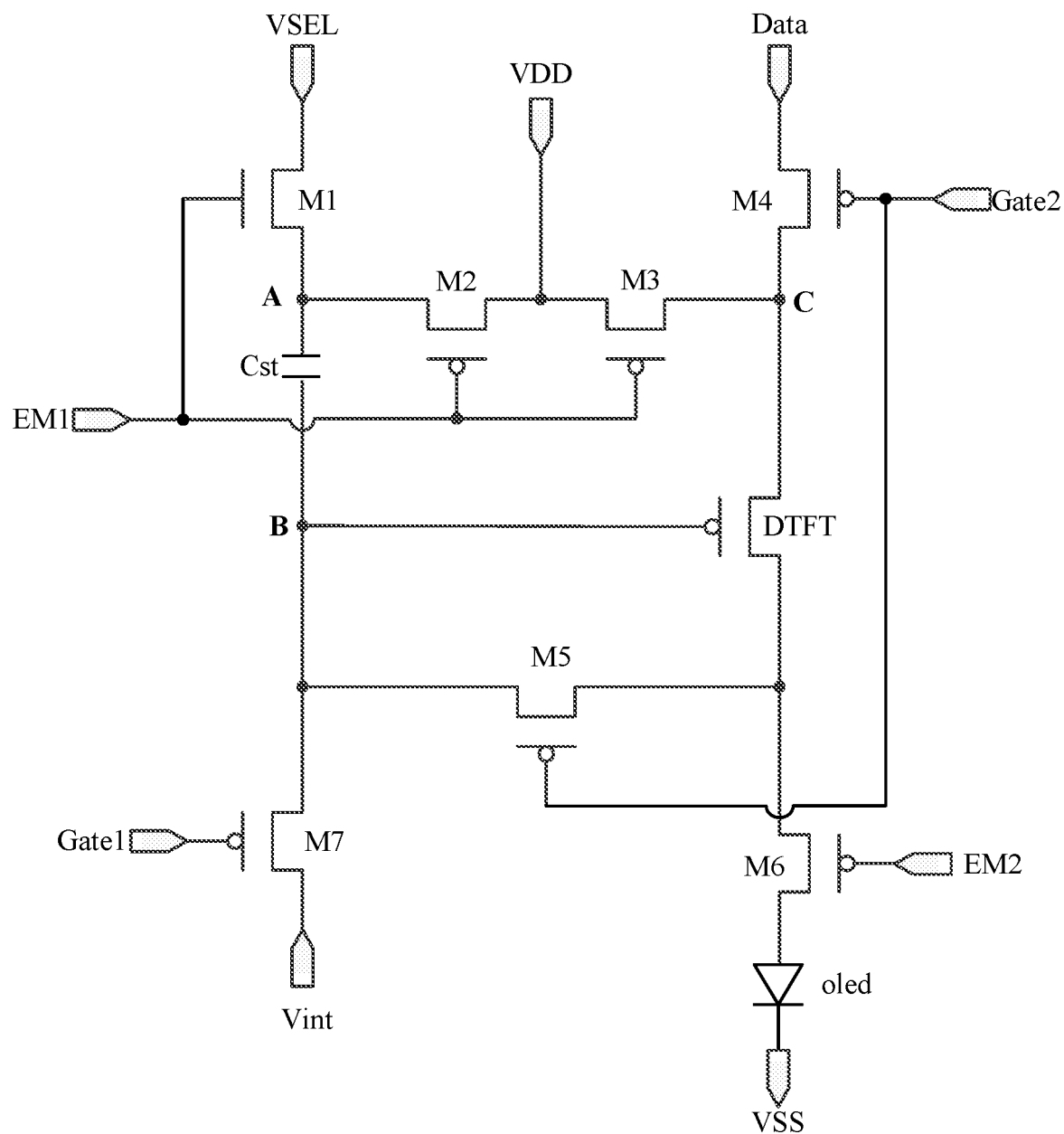
FIG. 3 is a third schematic structural diagram of the pixel circuit according to the embodiment of the disclosure.

In some embodiments of the disclosure, in the pixel circuit, as illustrated in FIG. 3, the prewriting control terminal and the first light-emission control terminal EM1 are the same signal terminal, so that the number of wires in the circuit can be reduced.

Figure 5:
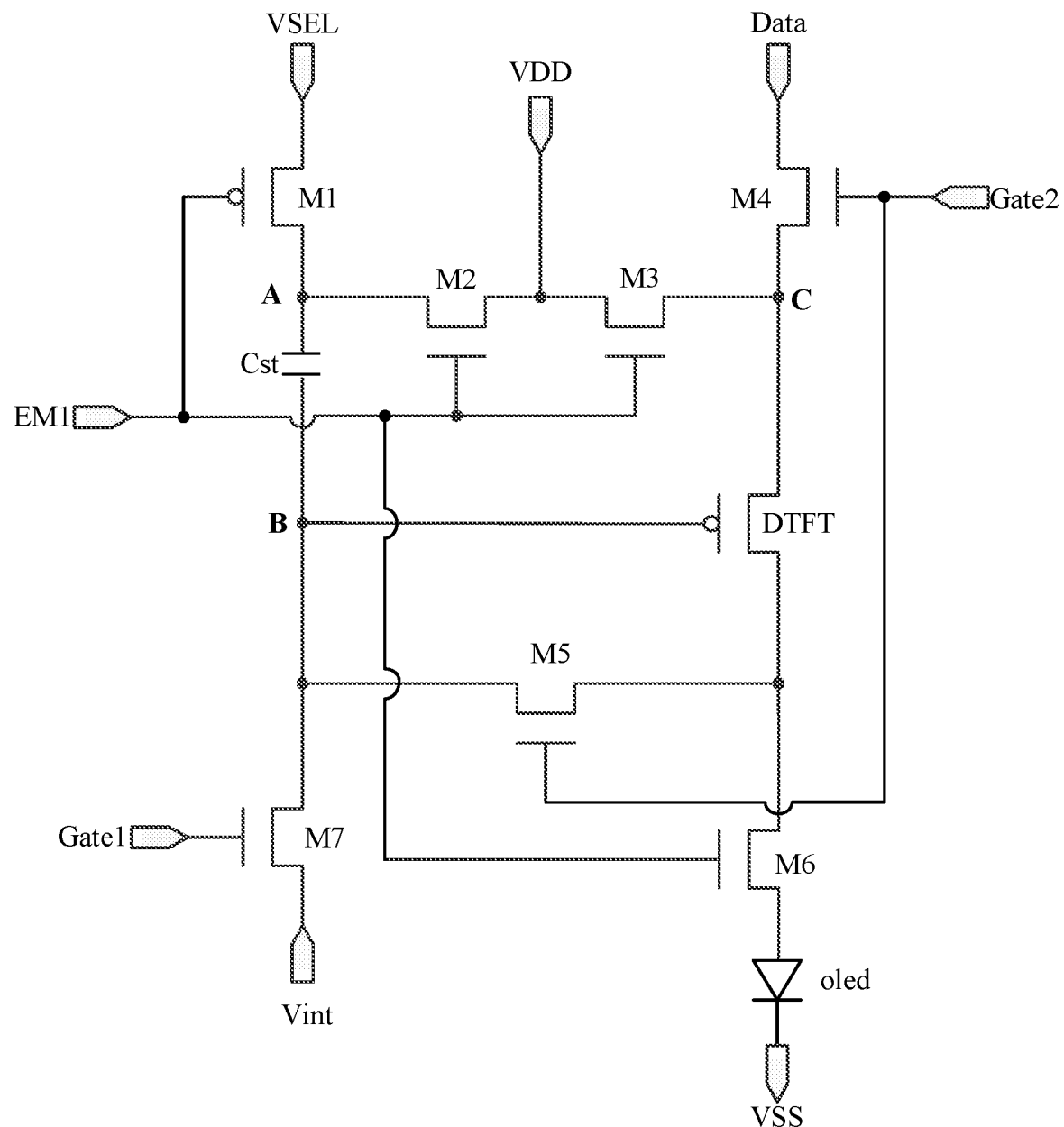
FIG. 5 is a fifth schematic structural diagram of the pixel circuit according to the embodiment of the disclosure.

For normal operating, when the prewriting control terminal and the first light-emission control terminal are the same signal terminal, the first transistor M1 is an N-type transistor, and the second transistor M2 and the third transistor M3 are P-type transistors, as illustrated in FIG. 3; or the first transistor M1 is a P-type transistor, and the second transistor M2 and the third transistor M3 are N-type transistors, as illustrated in FIG. 5. Thus the second transistor M2 and the third transistor M3 are turned on, and the first transistor M1 is turned off, in the light-emission period; and the second transistor M2 and the third transistor M3 are turned off and the first transistor M1 is turned on, before the light-emission period.

In some embodiments of the disclosure, in the pixel circuit, as illustrated in FIG. 2, the data writing sub-circuit 03 includes a fourth transistor M4.

The fourth transistor M4 has a gate connected with the second scan signal terminal Gate2, a first electrode connected with the data signal terminal Data, and a second electrode connected with the first electrode of the driver transistor DTFT.

Specifically when the fourth transistor M4 is turned on under the control of the second scan signal terminal Gate2, the signal of the data signal terminal Data is transmitted to the first electrode of the driver transistor DTFT through the fourth transistor M4 which is turned on, thus writing the data.

In a specific implementation, the fourth transistor M4 can be an N-type transistor, or can be a P-type transistor, although the embodiment of the disclosure will not be limited thereto.

A specific structure of the data writing sub-circuit 03 in the pixel circuit has been described above only by way of an example, and in a specific implementation, the specific structure of the data writing sub-circuit 03 will not be limited to the structure above according to the embodiment of the disclosure, but can alternatively be another structure which can occur to those skilled in the art, and the embodiment of the disclosure will not be limited thereto.

In some embodiments of the disclosure, in the pixel circuit, as illustrated in FIG. 2, the threshold compensating sub-circuit 04 includes a fifth transistor M5.

The fifth transistor M5 has a gate connected with the second scan signal terminal Gate2, a first electrode connected with the gate of the driver transistor DTFT, and a second electrode connected with the second electrode of the driver transistor DTFT.

Specifically when the fifth transistor M5 is turned on under the control of the second scan signal terminal Gate2, the driver transistor DTFT is formed as a turned-on diode, the capacitor Cst is charged until the voltage difference between the first electrode and the gate of the driver transistor DTFT is equal to the threshold voltage thereof, thus compensating for the threshold voltage of the driver transistor DTFT.

In a specific implementation, the fifth transistor M5 can be an N-type transistor, or can be a P-type transistor, although the embodiment of the disclosure will not be limited thereto.

A specific structure of the threshold compensating sub-circuit 04 in the pixel circuit has been described above only by way of an example, and in a specific implementation, the specific structure of the threshold compensating sub-circuit 04 will not be limited to the structure above according to the embodiment of the disclosure, but can alternatively be another structure which can occur to those skilled in the art, and the embodiment of the disclosure will not be limited thereto.

In some embodiments of the disclosure, in the pixel circuit, as illustrated in FIG. 2, the second light-emission control sub-circuit 05 includes a sixth transistor M6.

The sixth transistor M6 has a gate connected with the second light-emission control terminal EM2, a first electrode connected with the second electrode of the driver transistor DTFT, and a second electrode connected with the light-emitting element oled.

Specifically when the sixth transistor M6 is turned on under the control of the second light-emission control terminal EM2, the driver transistor DTFT is connected with the light-emitting element oled.

In a specific implementation, the sixth transistor M6 can be an N-type transistor, or can be a P-type transistor, although the embodiment of the disclosure will not be limited thereto.

A specific structure of the second light-emission control sub-circuit 05 in the pixel circuit has been described above only by way of an example, and in a specific implementation, the specific structure of the second light-emission control sub-circuit 05 will not be limited to the structure above according to the embodiment of the disclosure, but can alternatively be another structure which can occur to those skilled in the art, and the embodiment of the disclosure will not be limited thereto.

Figure 4:
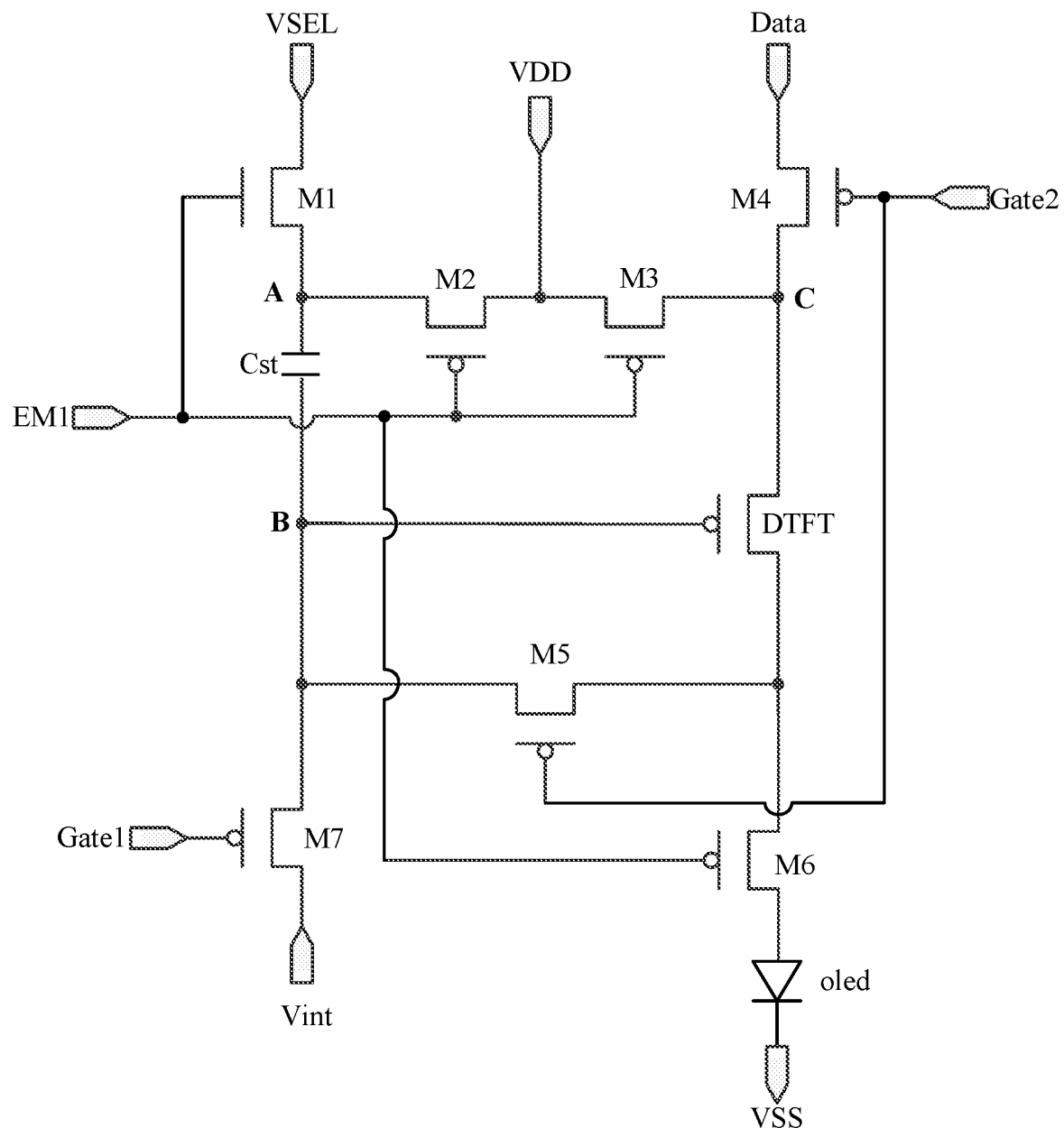
FIG. 4 is a fourth schematic structural diagram of the pixel circuit according to the embodiment of the disclosure.

In some embodiments of the disclosure, in the pixel circuit, as illustrated in FIG. 4, the second light-emission control terminal EM2 and the first light-emission control terminal EM1 are the same signal terminal, so that the number of wires in the circuit can be reduced.

Furthermore when the second light-emission control terminal EM2 and the first light-emission control terminal EM1 are the same signal terminal, all of the second transistor M2, the third transistor M3, and the sixth transistor M6 are P-type transistors as illustrated in FIG. 4; or all of the second transistor M2, the third transistor M3, and the sixth transistor M6 are N-type transistors as illustrated in FIG. 5.

In some embodiments of the disclosure, in the pixel circuit, as illustrated in FIG. 2, the initializing sub-circuit 06 includes a seventh transistor M7.

The seventh transistor M7 has a gate connected with the first scan signal terminal Gate1, a first electrode connected with an initial signal terminal Vint, and a second electrode connected with the gate of the driver transistor DTFT.

Specifically when the seventh transistor M7 is turned on under the control of the first scan signal terminal Gate1, a signal of the initial signal terminal Vint is transmitted to the gate of the driver transistor DTFT through the turned-on seventh transistor M7 to thereby reset the gate of the driver transistor DTFT before the light-emission period, so as to avoid a data signal of the last frame from affecting displaying of the current frame.

In a specific implementation, the seventh transistor M7 can be an N-type transistor, or can be a P-type transistor, although the embodiment of the disclosure will not be limited thereto.

A specific structure of the initializing sub-circuit 06 in the pixel circuit has been described above only by way of an example, and in a specific implementation, the specific structure of the initializing sub-circuit 06 will not be limited to the structure above according to the embodiment of the disclosure, but can alternatively be another structure which can occur to those skilled in the art, and the embodiment of the disclosure will not be limited thereto.

It shall be noted that the pixel circuit according to the embodiment of the disclosure has been described by way of an example in which the driver transistor DTFT is a P-type transistor, but the same principle will apply when the driver transistor DTFT is an N-type transistor, so a repeated description thereof will be omitted here.

Specifically as illustrated in FIG. 1 to FIG. 5, the other end of the light-emitting element oled is generally connected with a second voltage source VEE. When the driver transistor DTFT is a P-type transistor, since threshold voltage of the P-type transistor is negative, in order to enable the driver transistor DTFT to operate normally, the voltage of the first voltage source VDD is generally higher than voltage of the second voltage source VEE.

In a specific implementation, in order to simplify the flow of a process of fabricating the pixel circuit, in the pixel circuit above according to the embodiment of the disclosure, all of the first transistor M1, the second transistor M2, the third transistor M3, the fourth transistor M4, the fifth transistor M5, the sixth transistor M6, and the seventh transistor M7 can be P-type transistors, or can be N-type transistors, although the embodiment of the disclosure will not be limited thereto.

Specifically the N-type transistors are turned on under the control of a high-level signal, and turned off under the control of a low-level signal; and the P-type transistors are turned on under the control of a low-level signal, and turned off under the control of a high-level signal.

It shall be noted that the transistors mentioned in the embodiment above of the disclosure can be Thin Film Transistors (TFTs), or can be Metal Oxide Semiconductor Field-Effect Transistors (MOSFETs), although the embodiment of the disclosure will not be limited thereto. In a specific implementation, the first electrodes of these transistors can be sources, and the second electrodes thereof can be drains, or the first electrodes can be drains, and the second electrodes can be sources.

Figure 6:
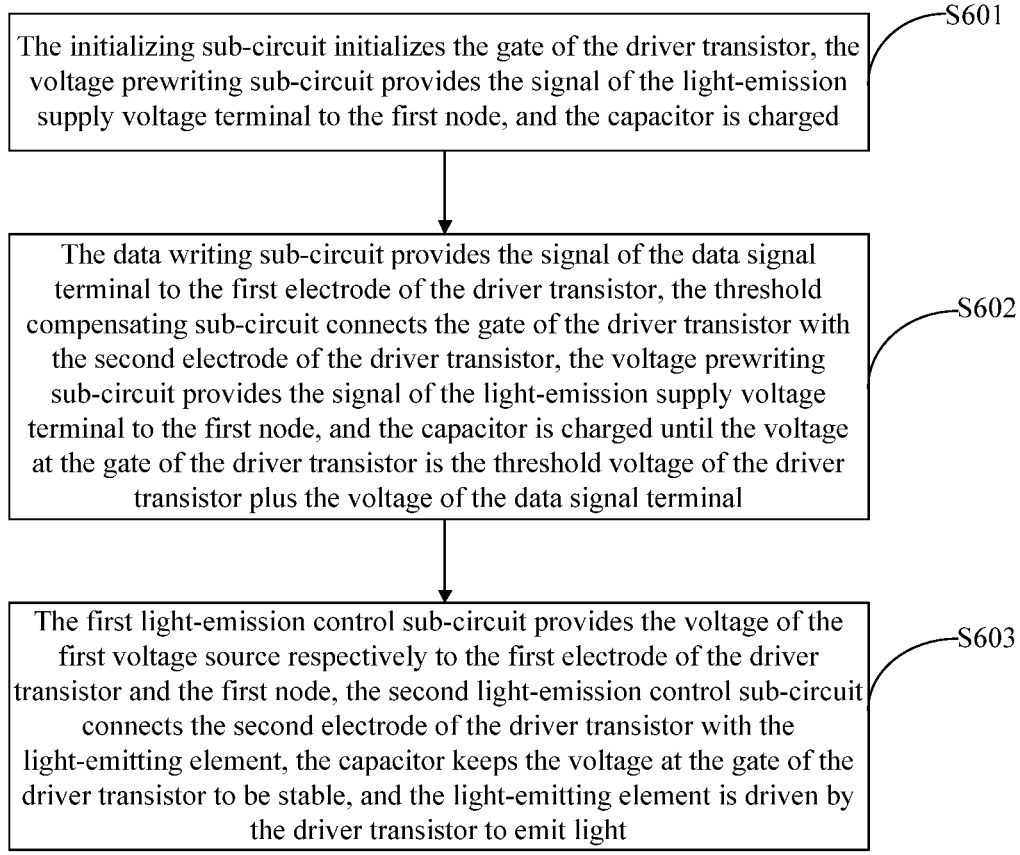
FIG. 6 is a schematic flow chart of a method for driving the pixel circuit according to the embodiment of the disclosure.

Based upon the same inventive idea, an embodiment of the disclosure further provides a method for driving the pixel circuit above, and as illustrated in FIG. 6, the method includes the following steps.

In the step S601, in an initialization period, the initializing sub-circuit initializes the gate of the driver transistor, the voltage prewriting sub-circuit provides the signal of the light-emission supply voltage terminal to the first node, and the capacitor is charged.

In the initialization period, the capacitor is charged under the control of the potential of the first node and the potential of the gate of the driver transistor.

In the step S602, in a data writing period, the data writing sub-circuit provides the signal of the data signal terminal to the first electrode of the driver transistor, the threshold compensating sub-circuit connects the gate of the driver transistor with the second electrode of the driver transistor, the voltage prewriting sub-circuit provides the signal of the light-emission supply voltage terminal to the first node, and the capacitor is charged until the voltage at the gate of the driver transistor is the threshold voltage of the driver transistor plus the voltage of the data signal terminal.

In the step S603, in a light-emission period, the first light-emission control sub-circuit provides the voltage of the first voltage source respectively to the first electrode of the driver transistor and the first node, the second light-emission control sub-circuit connects the second electrode of the driver transistor with the light-emitting element, the capacitor keeps the voltage at the gate of the driver transistor to be stable, and the light-emitting element is driven by the driver transistor to emit light.

An operating process of the pixel circuit according to the embodiment of the disclosure will be described below in connection with the driving method. For the sake of a convenient description, the gate of the driver transistor DTFT may be referred to as a second node B, and the first electrode of the driver transistor DTFT may be referred to as a third node C; and in the following description, 1 may represent a high-level signal, and 0 may represent a low-level signal.

Figure 7:
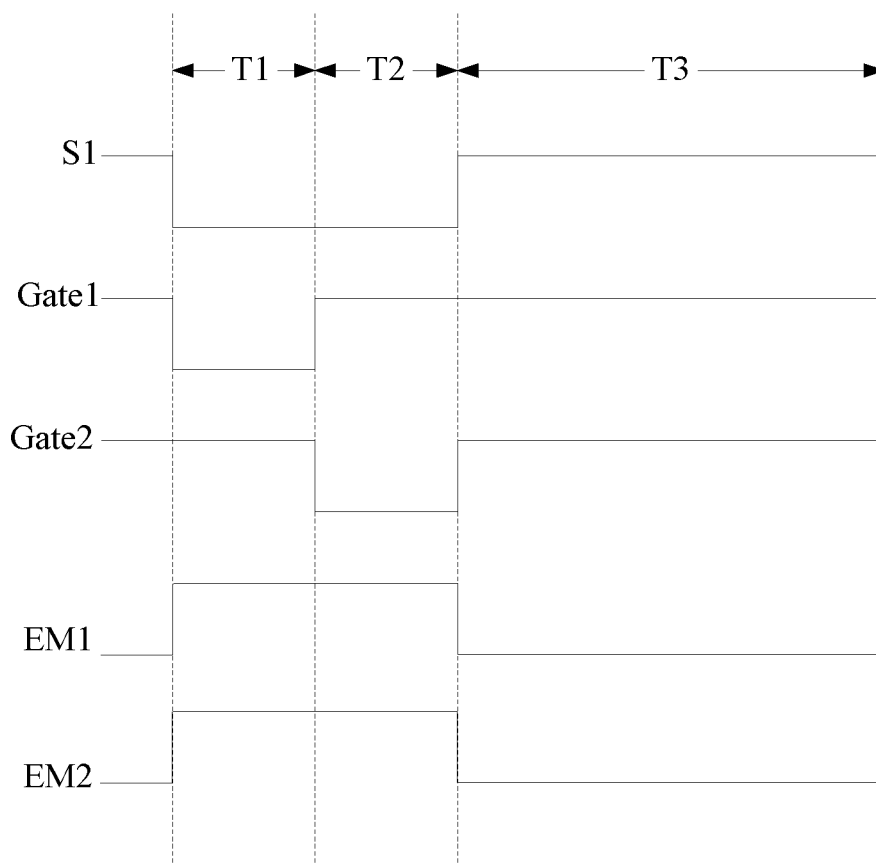
FIG. 7 is an input timing diagram of the pixel circuit of FIG. 2.

Specifically taking the pixel circuit as illustrated in FIG. 2 as an example, all of the driver transistors DTFT, and the first transistor M1 to the seventh transistor M7 are P-type transistors, FIG. 7 illustrates an input timing diagram corresponding thereto. There are three selected periods T1, T2, and T3 in the input timing diagram as illustrated in FIG. 7.

In the period T1 (the initialization period), S1=0, Gate1=0, Gate2=1, EM1=1, and EM2=1.

The first transistor M1 and the seventh transistor M7 are turned on, and second transistor M2, the third transistor M3, the fourth transistor M4, the fifth transistor M5, and the sixth transistor M6 are turned off. The signal of the initial signal terminal Vint is transmitted to the second node B through the turned-on seventh transistor M7, the level of the second node B is changed to Vint, the signal of the light-emission supply voltage terminal VSEL is transmitted to the first node A through the turned-on first transistor M1, the potential at the first node A is changed to VSEL, and the capacitor Cst starts to be charged.

In the period T2 (the data writing period), S1=0, Gate1=1, Gate2=0, EM1=1, and EM2=1.

The first transistor M1, the fourth transistor M4, and the fifth transistor M5 are turned on, and the second transistor M2, the third transistor M3, the sixth transistor M6, and the seventh transistor M7 are turned off. The signal of the light-emission supply voltage terminal VSEL is transmitted to the first node A through the turned-on first transistor M1, the potential at the first node A is still VSEL, the turned-on fifth transistor M5 makes the driver transistor DTFT to be a diode, the signal of the data signal terminal Data is transmitted to the third node C through the turned-on fourth transistor M4, the potential at the third node C is changed to Vdata, the driver transistor DTFT is turned on, and the capacitor Cst is charged until the potential at the second node B is changed to Vdata+Vth, where Vth is the threshold voltage of the driver transistor.

In the period T3 (the light-emission period), S1=1, Gate1=1, Gate2=1, EM1=0, and EM2=0.

The second transistor M2, the third transistor M3, and the sixth transistor M6 are turned on, and the first transistor M1, the fourth transistor M4, the fifth transistor M5, and the seventh transistor M7 are turned off. The voltage of the first voltage source VDD is transmitted to the third node C through the turned-on third transistor M3, and the potential at the third node C is changed to VDD; the voltage of the first voltage source VDD is transmitted to the first node A through the turned-on second transistor M2, the potential at the first node A is changed to VDD, and the potential at the second node B is changed to Vdata+Vth+(VDD-VSEL) due to bootstrapping of the capacitor Cst. At this time, the gate-source voltage Vgs of the driver transistor DTFT is Vgs=Vdata+Vth+(VDD-VSEL)-VDD, and the light-emission current I of the driver transistor DFT to drive the light-emitting element oled to emit light is I=K(Vgs-Vth)$^2$=K(Vdata-VSEL)$^2$; and the light-emitting element oled emits light.

Since K=WC$_{ox}$μ/2L is a structural parameter, the value of which is relatively stable in the same structure, it can be regarded as a constant. As can be apparent, the light-emission current of the light-emitting element oled is independent of the threshold voltage of the driver transistor and the voltage of the first voltage source VDD, thus improving the non-uniformity of a displayed image on the display panel.

Figure 8:
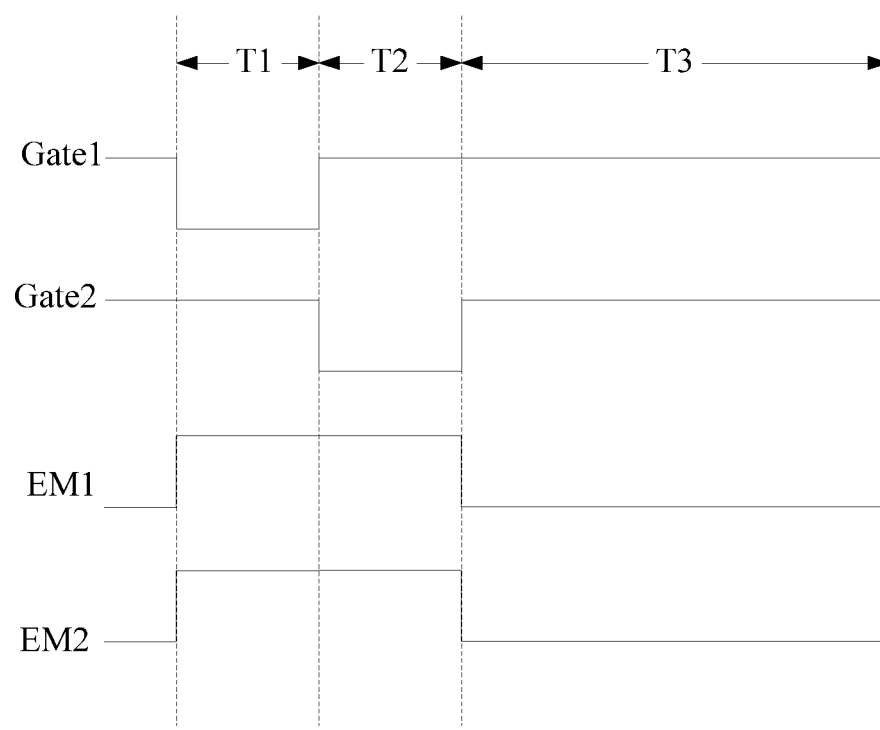
FIG. 8 is an input timing diagram of the pixel circuit of FIG. 3.
Figure 9:
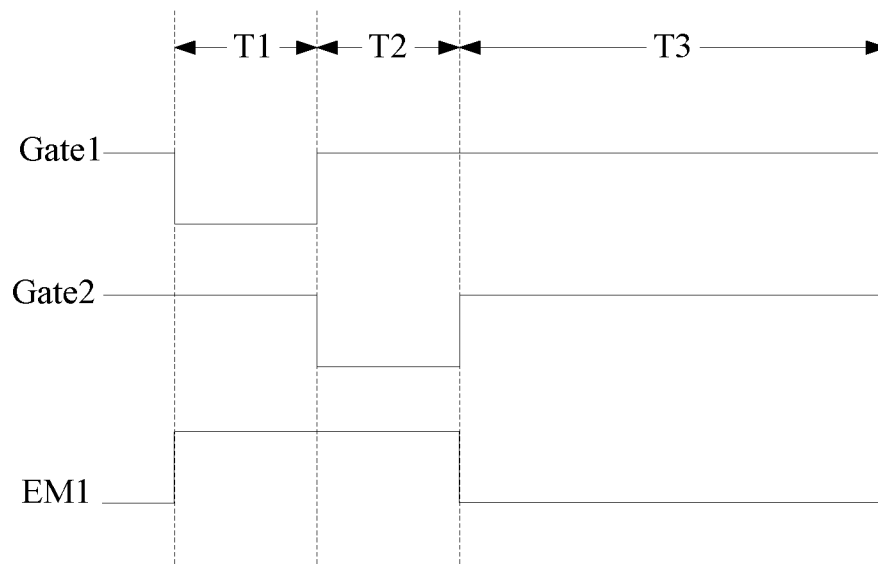
FIG. 9 is an input timing diagram of the pixel circuit of FIG. 4.
Figure 10:
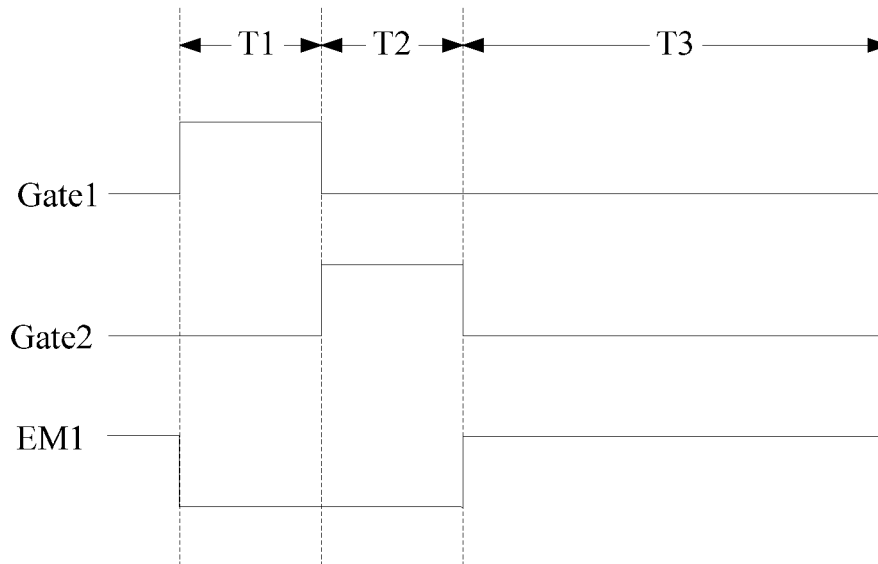
FIG. 10 is an input timing diagram of the pixel circuit of FIG. 5.

Specifically FIG. 8 illustrates an input timing diagram corresponding to the pixel circuit as illustrated in FIG. 3, FIG. 9 illustrates an input timing diagram corresponding to the pixel circuit as illustrated in FIG. 4, and FIG. 10 illustrates an input timing diagram corresponding to the pixel circuit as illustrated in FIG. 5. The operating principle of the pixel circuit as illustrated in FIG. 3 to FIG. 5 will be the same as the operating principle of the pixel circuit as illustrated in FIG. 2, so a repeated description thereof will be omitted here.

Based upon the same inventive idea, an embodiment of the disclosure further provides an organic light-emitting diode display panel including the pixel circuit above according to the embodiment of the disclosure. The organic light-emitting diode display panel can be a display panel of a computer, a mobile phone, a TV set, a notebook computer, an all-in-one computer, etc., and all the other components indispensable to the display panel shall readily occur to those ordinarily skilled in the art, so a repeated description thereof will be omitted here, and the embodiment of the disclosure will not be limited thereto.

Based upon the same inventive idea, an embodiment of the disclosure further provides a display device including the organic light-emitting diode display panel above according to the embodiment of the disclosure. The display device can be a mobile phone, a tablet computer, a TV set, a display, a notebook computer, a digital photo frame, a navigator, or any other product or component with a display function. Reference can be made to the embodiment of the organic light-emitting diode display panel above for an implementation of the display device, so a repeated description thereof will be omitted here.

In the pixel circuit, the method for driving the same, the organic light-emitting diode display panel, and the display device above according to the embodiments of the disclosure, the pixel circuit includes a driver transistor, a data writing sub-circuit, an initializing sub-circuit, a voltage prewriting sub-circuit, a threshold compensating sub-circuit, a first light-emission control sub-circuit, a second light-emission control sub-circuit, a capacitor, and a light-emitting element. The initializing sub-circuit is configured to initialize a gate of the driver transistor to thereby reset the gate of the driver transistor; the data writing sub-circuit is configured to provide a signal of a data signal terminal to a first electrode of the driver transistor to thereby write the data; the capacitor is configured to be charged or discharged; the voltage prewriting sub-circuit is configured to provide a signal of a light-emission supply voltage terminal to a first node to thereby store in advance the voltage of the light-emission supply voltage terminal in the capacitor; the threshold compensating sub-circuit is configured to connect the gate of the driver transistor with a second electrode of the driver transistor to thereby compensate for threshold voltage; the first light-emission control sub-circuit is configured to provide voltage of a first voltage source respectively to the first node of the driver transistor and the first node; and the second light-emission control sub-circuit is configured to connect the second electrode of the driver transistor with the light-emitting element, so that the light-emitting element emits light. However since the voltage prewriting sub-circuit stores in advance the voltage of the light-emission supply voltage terminal into the capacitor before light emission, although light emission is driven by the first voltage source, the magnitude of light-emission current is dependent upon the voltage of the light-emission supply voltage terminal, and independent of the voltage of the first voltage source, thus avoiding a voltage drop of the first voltage source in a light-emission period from affecting the light-emitting element, and improving the non-uniformity of a displayed image on an OLED display screen.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A pixel circuit, comprising: a driver transistor, a data writing sub-circuit, an initializing sub-circuit, a voltage prewriting sub-circuit, a threshold compensating sub-circuit, a first light-emission control sub-circuit, a second light-emission control sub-circuit, a capacitor and a light-emitting element, wherein:

the initializing sub-circuit has an output terminal connected with a gate of the driver transistor, and is configured to initialize the gate of the driver transistor under the control of a first scan signal terminal;

the data writing sub-circuit has an output terminal connected with a first electrode of the driver transistor, and is configured to provide a signal of a data signal terminal to the first electrode of the driver transistor under the control of a second scan signal terminal;

the capacitor is connected between the gate of the driver transistor and a first node, and configured to be charged or discharged according to a potential at the gate of the driver transistor and a potential at the first node;

the voltage prewriting sub-circuit has an output terminal connected with the first node, and is configured to provide a signal of a light-emission supply voltage terminal to the first node under the control of a prewriting control terminal;

the threshold compensating sub-circuit is connected between the gate of the driver transistor and a second electrode of the driver transistor, and configured to connect the gate of the driver transistor with the second electrode of the driver transistor under the control of the second scan signal terminal;

the first light-emission control sub-circuit is connected between the first node and the first electrode of the driver transistor, and configured to provide voltage of a first voltage source respectively to the first electrode of the driver transistor and the first node under the control of a first light-emission control terminal; and the second light-emission control sub-circuit is connected between the second electrode of the driver transistor and the light-emitting element, and configured to connect the second electrode of the driver transistor with the light-emitting element under the control of a second light-emission control terminal.

2. The pixel circuit according to claim 1, wherein the voltage prewriting sub-circuit comprises a first transistor, wherein:
the first transistor has a gate connected with the prewriting control terminal, a first electrode connected with the light-emission supply voltage terminal, and a second electrode connected with the first node.

3. The pixel circuit according to claim 2, wherein the first light-emission control sub-circuit comprises a second transistor and a third transistor, wherein:
the second transistor has a gate connected with the first light-emission control terminal, a first electrode connected with the first voltage source, and a second electrode connected with the first node; and
the third transistor has a gate connected with the first light-emission control terminal, a first electrode connected with the first voltage source, and a second electrode connected with the first electrode of the driver transistor.

4. The pixel circuit according to claim 3, wherein the prewriting control terminal and the first light-emission control terminal are a same signal terminal; and
the first transistor is an N-type transistor, and the second transistor and the third transistor are P-type transistors; or the first transistor is a P-type transistor, and the second transistor and the third transistor are N-type transistors.

5. The pixel circuit according to claim 3, wherein the second light-emission control sub-circuit comprises a sixth transistor, wherein:
the sixth transistor has a gate connected with the second light-emission control terminal, a first electrode connected with the second electrode of the driver transistor, and a second electrode connected with the light-emitting element.

6. The pixel circuit according to claim 5, wherein the second light-emission control terminal and the first light-emission control terminal are a same signal terminal; and
all of the second transistor, the third transistor, and the sixth transistor are N-type transistors; or all of the second transistor, the third transistor, and the sixth transistor are P-type transistors.

7. The pixel circuit according to claim 1, wherein the data writing sub-circuit comprises a fourth transistor, wherein:
the fourth transistor has a gate connected with the second scan signal terminal, a first electrode connected with the data signal terminal, and a second electrode connected with the first electrode of the driver transistor.

8. The pixel circuit according to claim 1, wherein the threshold compensating sub-circuit comprises a fifth transistor, wherein:
the fifth transistor has a gate connected with the second scan signal terminal, a first electrode connected with the gate of the driver transistor, and a second electrode connected with the second electrode of the driver transistor.

9. The pixel circuit according to claim 1, wherein the initializing sub-circuit comprises a seventh transistor, wherein:
the seventh transistor has a gate connected with the first scan signal terminal, a first electrode connected with an initial signal terminal, and a second electrode connected with the gate of the driver transistor.

10. The pixel circuit according to claim 1, wherein:
the voltage prewriting sub-circuit comprises a first transistor, the first transistor has a gate connected with the prewriting control terminal, a first electrode connected with the light-emission supply voltage terminal, and a second electrode connected with the first node;
the first light-emission control sub-circuit comprises a second transistor and a third transistor, the second transistor has a gate connected with the first light-emission control terminal, a first electrode connected with the first voltage source, and a second electrode connected with the first node; and the third transistor has a gate connected with the first light-emission control terminal, a first electrode connected with the first voltage source, and a second electrode connected with the first electrode of the driver transistor;
the data writing sub-circuit comprises a fourth transistor, the fourth transistor has a gate connected with the second scan signal terminal, a first electrode connected with the data signal terminal, and a second electrode connected with the first electrode of the driver transistor;
the threshold compensating sub-circuit comprises a fifth transistor, the fifth transistor has a gate connected with the second scan signal terminal, a first electrode connected with the gate of the driver transistor, and a second electrode connected with the second electrode of the driver transistor;
the second light-emission control sub-circuit comprises a sixth transistor, the sixth transistor has a gate connected with the second light-emission control terminal, a first electrode connected with the second electrode of the driver transistor, and a second electrode connected with the light-emitting element;
the initializing sub-circuit comprises a seventh transistor, the seventh transistor has a gate connected with the first scan signal terminal, a first electrode connected with an initial signal terminal, and a second electrode connected with the gate of the driver transistor.

11. A method for driving the pixel circuit according to claim 1, the method comprising:
in an initialization period, initializing, by the initializing sub-circuit, the gate of the driver transistor under the control of the first scan signal terminal, providing, by the voltage prewriting sub-circuit, the signal of the light-emission supply voltage terminal to the first node under the control of the prewriting control terminal, and charging the capacitor;
in a data writing period, providing, by the data writing sub-circuit, the signal of the data signal terminal to the first electrode of the driver transistor under the control of the second scan signal terminal, connecting, by the threshold compensating sub-circuit, the gate of the driver transistor with the second electrode of the driver transistor under the control of the second scan signal terminal, providing, by the voltage prewriting sub-circuit, the signal of the light-emission supply voltage terminal to the first node under the control of the prewriting control terminal, and charging the capacitor until the voltage at the gate of the driver transistor is the threshold voltage of the driver transistor plus the voltage of the data signal terminal; and
in a light-emission period, providing, by the first light-emission control sub-circuit, the voltage of the first voltage source respectively to the first electrode of the driver transistor and the first node under the control of the first light-emission control terminal, connecting, by the second light-emission control sub-circuit, the second electrode of the driver transistor with the light-emitting element under the control of the second light-emission control terminal, keeping, by the capacitor, the voltage at the gate of the driver transistor to be stable, and driving, by the driver transistor, the light-emitting element to emit light.

12. An organic light-emitting diode display panel, comprising the pixel circuit according to claim 1.

13. A display device, comprising the organic light-emitting diode display panel according to claim 12.

\* \* \* \* \*